(12) United States Patent
Park et al.

(10) Patent No.: US 6,965,519 B1
(45) Date of Patent: Nov. 15, 2005

(54) CONTENT ADDRESSABLE MEMORY (CAM) DEVICES THAT UTILIZE DUAL-CAPTURE MATCH LINE SIGNAL REPEATERS TO ACHIEVE DESIRED SPEED/POWER TRADEOFF AND METHODS OF OPERATING SAME

(75) Inventors: Kee Park, San Jose, CA (US); Scott Yu-Fan Chu, San Jose, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 183 days.

(21) Appl. No.: 10/464,598

(22) Filed: Jun. 18, 2003

(51) Int. Cl.$^7$ .................................... G11C 15/00
(52) U.S. Cl. ................... 365/49; 365/203; 365/189.07; 365/189.11
(58) Field of Search ............... 365/49, 203, 189.07, 365/189.11

(56) References Cited

U.S. PATENT DOCUMENTS

| | | | |
|---|---|---|---|
| 5,327,372 A | 7/1994 | Oka et al. .................... 315/49 |
| 5,440,715 A | 8/1995 | Wyland ...................... 395/435 |
| 5,446,685 A | 8/1995 | Holst ......................... 365/49 |
| 5,517,441 A | 5/1996 | Dietz et al. .................. 365/49 |
| 5,598,115 A | 1/1997 | Holst ......................... 326/119 |
| 5,706,224 A | 1/1998 | Srinivasan et al. ........... 365/49 |
| 5,852,569 A | 12/1998 | Srinivasan et al. ........... 365/49 |
| 5,859,791 A | 1/1999 | Schultz et al. ............... 365/49 |
| 5,936,873 A | 8/1999 | Kongetira .................... 365/49 |
| 5,964,857 A | 10/1999 | Srinivasan et al. .......... 710/126 |
| 5,978,246 A | 11/1999 | Shindo ........................ 365/49 |
| 6,044,005 A | 3/2000 | Gibson et al. ................ 365/49 |
| 6,101,115 A | 8/2000 | Ross .......................... 365/49 |
| 6,101,116 A | 8/2000 | Lien et al. ................... 365/49 |
| 6,125,049 A | 9/2000 | Nataraj ....................... 365/49 |
| 6,128,207 A | 10/2000 | Lien et al. ................... 365/49 |
| 6,147,891 A | 11/2000 | Nataraj ....................... 365/49 |
| 6,166,939 A | 12/2000 | Nataraj et al. ................ 365/49 |
| 6,175,514 B1 | 1/2001 | Henderson et al. ........... 365/49 |
| 6,191,969 B1 | 2/2001 | Pereira ........................ 365/49 |
| 6,191,970 B1 | 2/2001 | Pereira ........................ 365/49 |
| 6,195,278 B1 | 2/2001 | Calin et al. ................... 365/49 |
| 6,240,001 B1 | 5/2001 | Ross .......................... 365/49 |
| 6,243,280 B1 | 6/2001 | Wong et al. .................. 365/49 |
| 6,243,281 B1 | 6/2001 | Pereira ........................ 365/49 |
| 6,246,601 B1 | 6/2001 | Pereira ........................ 365/49 |
| 6,252,789 B1 | 6/2001 | Pereira et al. ................ 365/49 |
| 6,256,216 B1 | 7/2001 | Lien et al. ................... 365/49 |
| 6,262,907 B1 | 7/2001 | Lien et al. ................... 365/49 |

(Continued)

Primary Examiner—Connie C. Yoha
(74) Attorney, Agent, or Firm—Myers Bigel Sibley & Sajovec PA (57) ABSTRACT

Segmented CAM arrays are provided with dual-capture match line signal repeaters that support high speed pipelined search operations. A dual-capture match line signal repeater may extend between xR and xS segments of CAM cells within a respective row. This repeater provides high speed operation by quickly accessing the state (match or miss) of a match line segment when a corresponding segment of CAM cells connected to the match line segment undergo a respective stage of a pipelined search operation. If the match line segment is initially assessed as having a match signal thereon, then that match signal is passed to a next higher match line segment within the same row and a next stage search operation is commenced. However, if the match line segment is erroneously assessed as having a match signal thereon, when a miss condition was actually present in the corresponding segment of CAM cells, then the signal repeater will operate to capture a late miss signal and pass that late miss signal to the next higher match line segment to correct an error.

34 Claims, 5 Drawing Sheets

U.S. PATENT DOCUMENTS

| | | | |
|---|---|---|---|
| 6,262,929 B1 | 7/2001 | Miyatake et al. | 365/203 |
| 6,324,087 B1 | 11/2001 | Pereira | 365/49 |
| 6,341,079 B1 | 1/2002 | Chadwick | 365/49 |
| 6,343,029 B1 | 1/2002 | Kengeri et al. | 365/49 |
| 6,349,049 B1 | 2/2002 | Schoy | 365/49 |
| 6,362,993 B1 | 3/2002 | Henderson et al. | 365/49 |
| 6,370,613 B1 | 4/2002 | Diede et al. | 711/108 |
| 6,373,738 B1 | 4/2002 | Towler et al. | 365/49 |
| 6,430,074 B1 | 8/2002 | Srinivasan | 365/49 |
| 6,452,822 B1 | 9/2002 | Chai et al. | 365/49 |
| 6,499,081 B1 | 12/2002 | Nataraj et al. | 711/108 |
| 6,512,682 B2 | 1/2003 | Cohen et al. | 363/146 |
| 6,560,670 B1 | 5/2003 | Ichiriu | 711/108 |
| 6,584,003 B1 | 6/2003 | Kim et al. | 365/49 |
| 6,597,596 B2 | 7/2003 | Gordon et al. | 365/49 |
| 6,661,716 B1 * | 12/2003 | Sywyk | 365/191 |
| 6,690,198 B2 * | 2/2004 | Mueller et al. | 365/86 |
| 6,697,277 B2 | 2/2004 | Towler et al. | 365/49 |
| 6,732,227 B1 | 5/2004 | Baumann | 711/108 |
| 6,768,659 B2 * | 7/2004 | Gillingham et al. | 365/49 |
| 2003/0070039 A1 | 4/2003 | Gillingham | 711/108 |
| 2003/0123269 A1 | 7/2003 | Gillingham et al. | 365/49 |

* cited by examiner

CONTENT ADDRESSABLE MEMORY (CAM) DEVICES THAT UTILIZE DUAL-CAPTURE MATCH LINE SIGNAL REPEATERS TO ACHIEVE DESIRED SPEED/POWER TRADEOFF AND METHODS OF OPERATING SAME

FIELD OF THE INVENTION

The present invention relates to integrated circuit memory devices and methods of operating same, and more particularly to content addressable memory devices and methods of operating same.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data is not accessed by initially supplying an address, but rather by initially applying data (e.g., search words) to the device and then performing a search operation to identify one or more entries within the CAM device that contain data equivalent to the applied data and thereby represent a "match" condition. In this manner, data is accessed according to its content rather than its address. Upon completion of the search operation, the identified location(s) containing the equivalent data is typically encoded to provide an address (e.g., CAM array block address+row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM device to identify a highest priority matching entry. An exemplary CAM device that utilizes a priority encoder to identify a highest priority matching entry is disclosed in commonly assigned U.S. Pat. No. 6,370,613 to Diede et al., entitled "Content Addressable Memory with Longest Match Detect," the disclosure of which is hereby incorporated herein by reference. The '613 patent also discloses the use of CAM sub-arrays to facilitate pipelined search operations. Additional CAM devices are described in U.S. Pat. Nos. 5,706,224, 5,852,569 and 5,964,857 to Srinivasan et al. and in U.S. Pat. Nos. 6,101,116, 6,256,216, 6,128,207 and 6,262,907 to Lien et al., the disclosures of which are hereby incorporated herein by reference.

CAM cells are frequently configured as binary CAM cells that store only data bits (as "1" or "0" logic values) or as ternary CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array block having a plurality of entries therein of logical width N, then a compare operation will yield one or more match conditions whenever all the unmasked data bits of an entry in the ternary CAM array block are identical to the corresponding data bits of the applied search word. This means that if the applied search word equals {1011}, the following entries will result in a match condition in a CAM comprising ternary CAM cells: {1011}, {X011}, {1X11}, {10X1}, {101X}, {XX11}, {1XX1}, . . . , {1XXX}, {XXXX}.

Conventional techniques to reduce power consumption within CAM devices are disclosed in U.S. Pat. Nos. 6,191,969 and 6,191,970 to Pereira. In particular, the '969 patent discloses a CAM array having CAM cells therein that include a discharge circuit connected between each cell and a fixed ground potential. Each of the discharge circuits includes a control terminal coupled to receive a control signal indicative of the logical state of a match line segment in a respective row. These discharge circuits may be turned off to prevent discharge of respective match line segments during a search operation. U.S. Pat. No. 6,243,280 to Wong et al. also discloses a technique to selectively precharge match line segments during a search operation. However, the match line precharge circuit described in the '280 patent may suffer from relatively poor speed performance during a search operation. This poor speed performance may result whenever a wider timing margin is used in each stage of a search operation to account for worst case timing conditions. These worst case timing conditions can occur when only one CAM cell within a segment of CAM cells indicates a "miss" condition while all other CAM cells in the same segment indicate "match" conditions. Thus, in the '280 patent, the timing margin associated with each stage of a search operation should be sufficient to account for the presence of a "worst case" miss signal before a decision can be made on whether to precharge a match line segment associated with a next segment of CAM cells. U.S. Pat. No. 6,430,074 to Srinivasan discloses a precharge circuit that uses selective look-ahead match line precharging techniques. The following patents also disclose subject matter relating to match line precharging: U.S. Pat. Nos. 6,101,115; 6,125,049; 6,147,891; 6,166,939; 6,240,001; 6,262,929 and 6,343,029.

U.S. Pat. No. 5,517,441 to Dietz et al. discloses the use of inverters and pull-down transistors to pass match line signals from one match line segment to another match line segment during a search operation. U.S. Pat. Nos. 5,446,685 and 5,598,115 to Holst also disclose the use of rail-to-rail (i.e., Vdd-to-Vss) pulsed ground signals during search operations. These pulsed ground signals may facilitate selective match line discharge operations.

Figure 1:
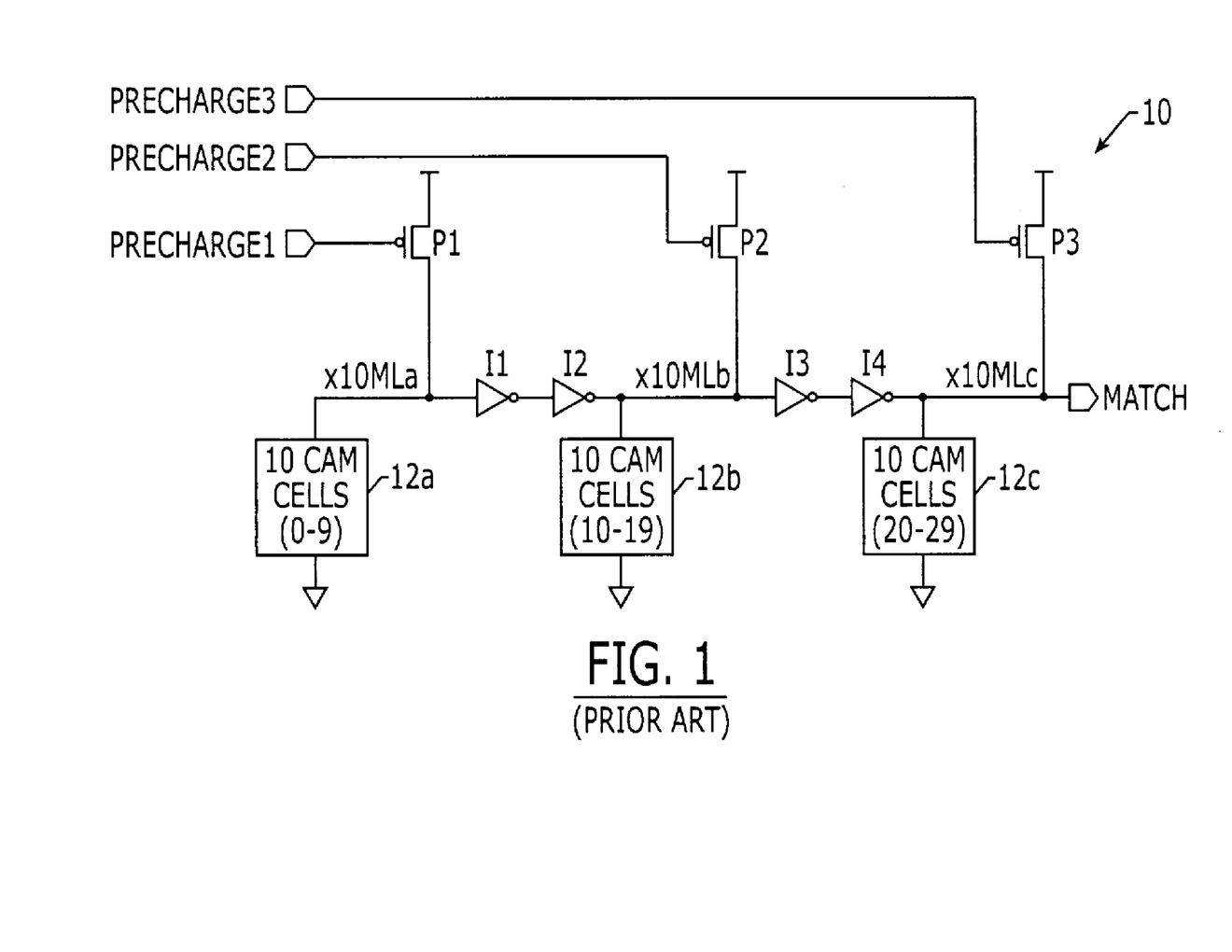
FIG. 1 is an electrical schematic of a row of CAM cells having a match line signal repeater therein, according to the prior art.

A conventional match line signal repeater is illustrated by FIG. 1. In particular, FIG. 1 illustrates a segmented row of CAM cells 10 that utilizes serially connected inverters 11–14 to pass match line signals from lower match line segments to upper match line segments during a search operation. The segmented row 10 is illustrated as including three equal-length match line segments (x10 MLa, x10 MLb and x10 MLc) that are each electrically coupled to respective segments of CAM cells 12a, 12b and 12c. Prior to commencement of a search operation, a plurality of active low precharge signals (PRECHARGE1–3) are switched high-to-low in sequence during a precharge time interval. When this occurs, PMOS precharge transistors P1–P3 turn on in sequence and precharge the three match line segments to logic 1 levels (e.g., Vdd). During this precharge time interval, pairs of differential comparand data lines (not shown), which are electrically connected to the segments of CAM cells 12a, 12b and 12c, are globally masked (i.e., both the true and complementary data lines within each pair are pulled low). A search word is then applied to the data lines to commence a search operation. During the search operation, at least one match line segment is pulled low if one or more miss conditions exist in the illustrated row 10. A worst case timing scenario may exist when only the leftmost CAM cell in the row 10 (i.e., CAM cell 0) indicates a miss and all other CAM cells (i.e., CAM cells 1–29) indicate a match (often referred to as a "hit"). When this occurs, a gradual pull-down of the first match line segment x10 MLa is accelerated from left-to-right across the match line segments x10 MLb and x10 MLc, by the inverters 11–14. Thus, the inverters 11–14, which may be designed to have relatively strong pull-down paths, can operate to increase the pull-down speed of the match line segments and thereby improve the worst case timing characteristics when search operations are performed.

Notwithstanding these conventional techniques to improve match line signal speed and reduce match line power consumption in segmented CAM arrays, there continues to be a need for additional techniques to further reduce power consumption and achieve high speed operation of CAM arrays having segmented match lines.

SUMMARY OF THE INVENTION

Embodiments of the present invention include CAM devices that utilize advanced timing and power saving techniques to support high frequency search operations within large capacity CAM arrays. In some embodiments, segmented CAM arrays are provided with low power match line signal repeaters that support high speed pipelined search operations in an efficient manner. An exemplary match line signal repeater includes a dual-capture match line signal repeater that extends between xR and xS segments of CAM cells within a respective row, where R and S are positive integers. This repeater provides high speed operation by quickly accessing the state (match or miss) of a match line segment when a corresponding segment of CAM cells connected to the match line segment undergoes a respective stage of a pipelined search operation. If the match line segment is initially assessed as having a match signal thereon, then that match signal is passed to a next match line segment within the same row and a next stage search operation is commenced. However, if the match line segment is erroneously assessed as having a match signal thereon, when a miss condition was actually present in the corresponding segment of CAM cells, then the signal repeater will operate to capture a late miss signal and pass that late miss signal to the next higher match line segment, and thereby correct the error.

In particular, a dual-capture match line signal repeater may be configured to: (i) transfer a "early" match signal from a xR match line segment to a next higher xS match line segment during an early capture time interval; and then (ii) transfer the "late" miss signal, if present, from the xR match line segment to the xS match line segment during a late capture time interval that terminates after termination of the early capture time interval. In this manner, an early assessment of a match condition can be made in order to shorten the per-stage search cycle time. However, if the early assessment is erroneous because a worst case miss condition was actually present (resulting in a weak miss signal that is represented by a relatively gradual high-to-low transition of the match line), then the erroneous assessment is corrected and provided to the next segment of CAM cells while that next segment is undergoing the next stage of the search operation. However, because such an erroneous assessment is typically rare, the benefit of shorter search latency more than adequately compensates for the infrequent case when match line power is not conserved.

Additional embodiments of the present invention include methods of performing pipelined search operations within a segmented CAM array. These methods may include applying a first segment of a search word to first data lines that are electrically coupled to the first segment of CAM cells during a first stage of the pipelined search operation. Then, after a relatively short evaluation time period has elapsed, an early match signal, if present, is passed from a first match line segment associated with the first segment of CAM cells to a second match line segment associated with a second segment of CAM cells. This passing of the match signal may be performed while second data lines, which are electrically coupled to the second segment of CAM cells, are globally masked. Then, during a second stage of the pipelined search operation, a second segment of the search word is applied to the second data lines and a late miss signal is simultaneously passed from the first match line segment to the second match line segment, to thereby correct for the early passing of an erroneous match signal.

Still further embodiments of the present invention are described more fully hereinbelow.

BRIEF DESCRIPTION OF THE DRAWINGS

FIG. 2 is an electrical schematic of a row of CAM cells having a dual-capture match line signal repeater therein according to embodiments of the present invention. This row is divided into two halves, with FIG. 2A illustrating a left half (columns <0:39>) and FIG. 2B illustrating a right half (columns <40:79>).

DETAILED DESCRIPTION OF PREFERRED EMBODIMENTS

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix B (or prefix symbol "/") to a signal name may also denote a complementary data or information signal or an active low control signal, for example.

Figures 2, 2A:
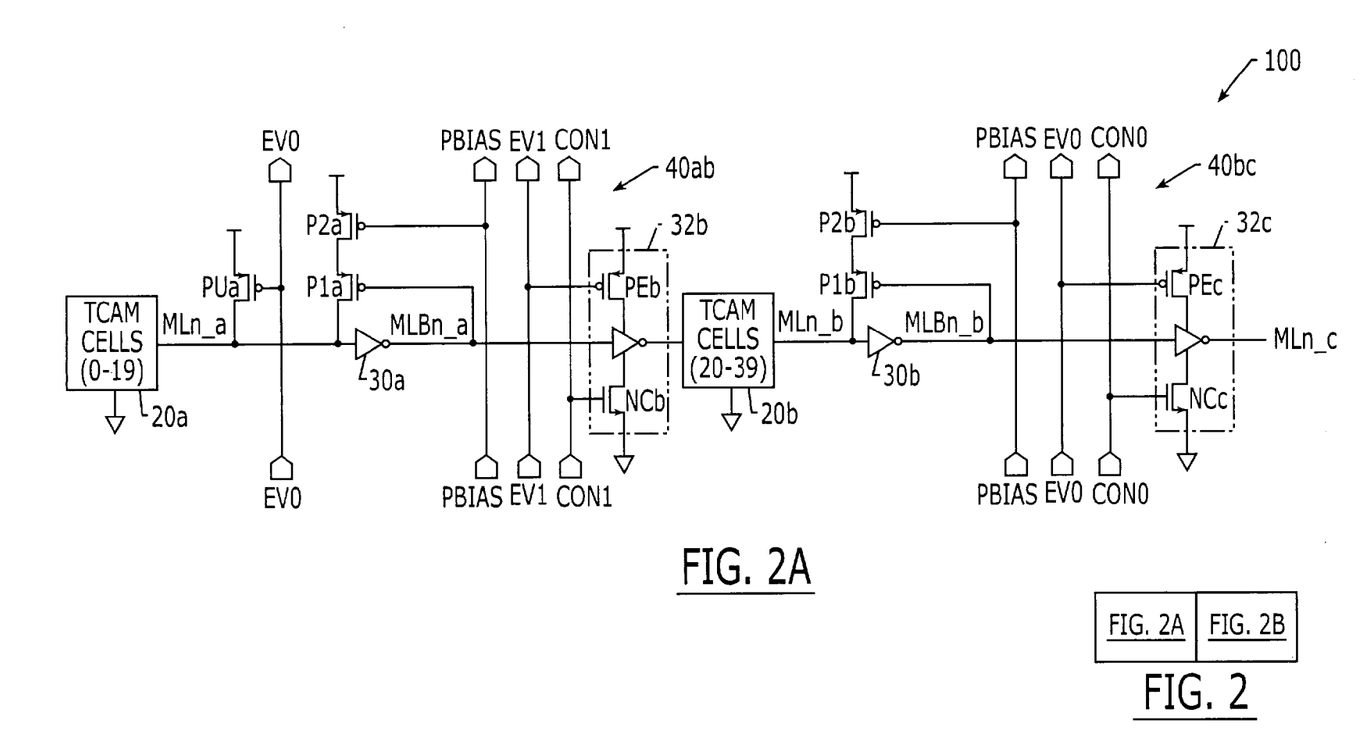
Figure 2B:
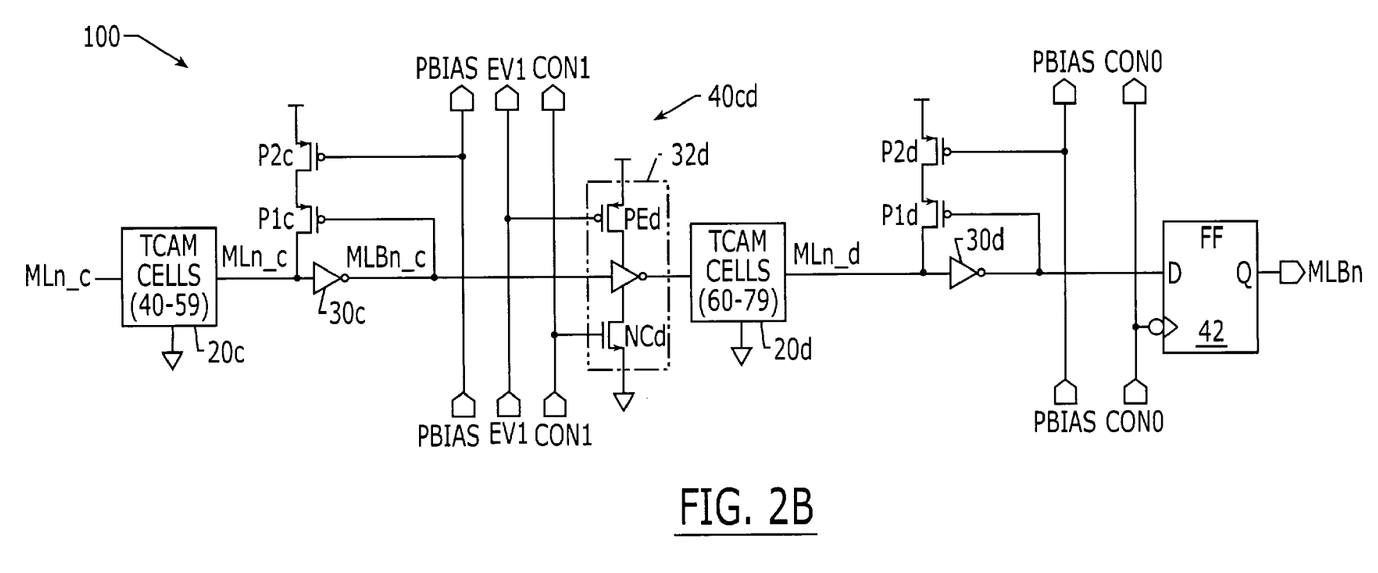
Figure 4:
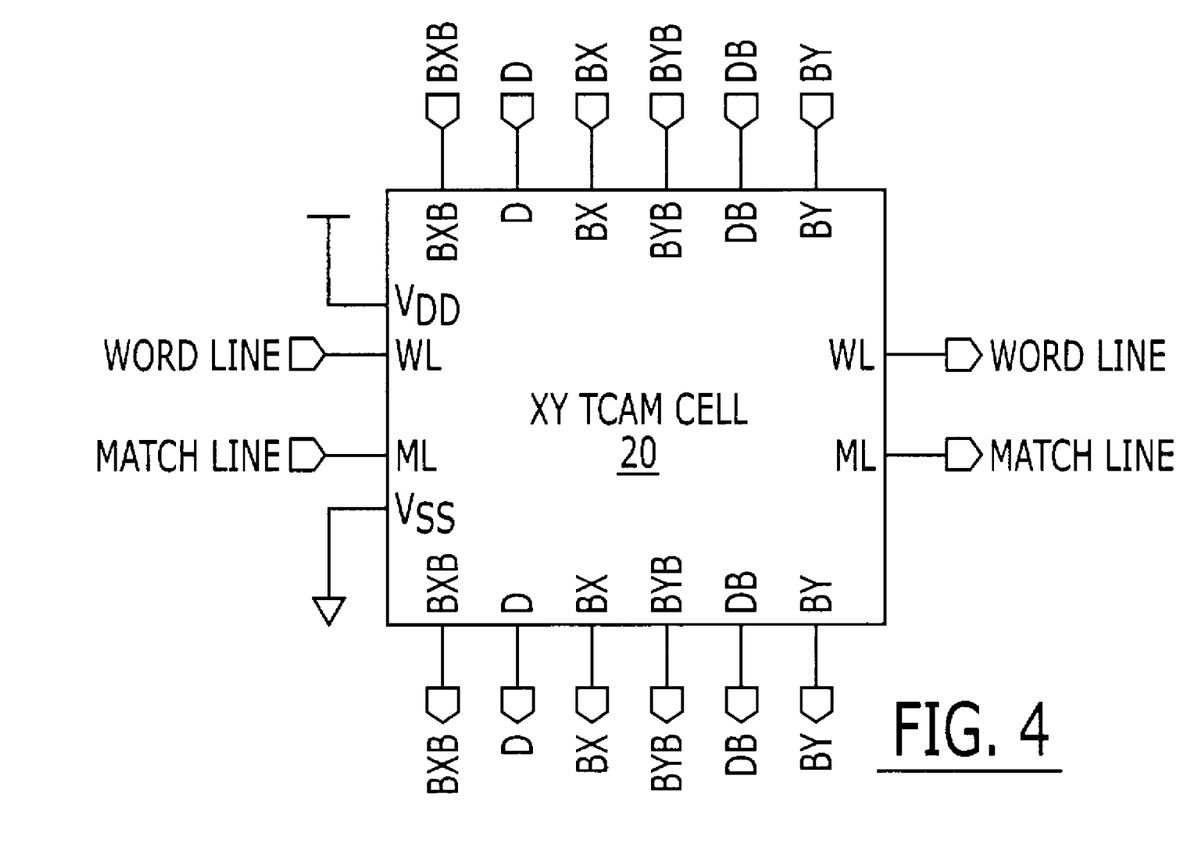
FIG. 4 is a block diagram of an XY ternary CAM (TCAM) cell that may be used in the embodiment of FIG. 2.

Referring now to FIG. 2, a content addressable memory (CAM) array having a segmented row 100 of CAM cells therein will be described. The row 100, which has been segmented into four equal width segments, is illustrated as having a logical width of 80 CAM cells, however, additional cells (not shown) may be added to one or more segments in order to provide column redundancy. Thus, in the illustrated embodiment, the segments each have a logical width of 20 CAM cells. These segments of CAM cells are described herein as a x20a segment, which spans columns 0–19, a x20b segment, which spans columns 20–39, a x20c segment, which spans columns 40–59, and a x20d segment, which spans columns 60–79. Other configurations of rows having a different number of segments and segments of unequal width are also possible. As illustrated by FIG. 4, the CAM cells may constitute ternary CAM (TCAM) cells, however, binary and quaternary CAM cells may also be used. In particular, FIG. 4 illustrates an XY TCAM cell 20 that is connected to two pairs of bit lines ((BX, BXB) and (BY, BYB)) and one pair of data lines (D, DB). The bit lines provide write data (or read data) to (or from) the CAM array during write (or read) operations. In contrast, the data lines provide comparand data (i.e., search words) to the CAM array during search operations. The XY CAM cell 22 is also illustrated as being connected to a respective word line (WL), a respective match line (ML), a power supply line Vdd and a ground reference line Vss.

The CAM cells in FIG. 2 are grouped according to segment. The first segment of CAM cells 20a, which spans columns 0–19 of the array, is electrically connected to a first x20a match line segment (shown as MLn_a, where "n" designates the row number). The second segment of CAM cells 20b, which spans columns 20–39 of the array, is electrically connected to a second x20b match line segment (shown as MLn_b). The third segment of CAM cells 20c, which spans columns 40–59 of the array, is electrically connected to a third x20c match line segment (shown as MLn_c). Finally, the fourth segment of CAM cells 20d, which spans columns 60–79 of the array, is electrically connected to a fourth x20d match line segment (shown as MLn_d).

A dual-capture match line signal repeater is provided between each of the illustrated match line segments. In particular, a first dual-capture match line signal repeater 40ab is provided between the match line segments MLn_a and MLn_b, a second dual-capture match line signal repeater 40bc is provided between match line segments MLn_b and MLn_c, and a third dual-capture match line signal repeater 40cd is provided between match line segments MLn_c and MLn_d.

The first signal repeater 40ab is illustrated as including a first inverter 30a and a second inverter 32b. The first inverter 30a may be defined internally by one PMOS pull-up transistor and one NMOS pull-down transistor. In contrast, the second inverter 32b, which has a tri-state output, includes a pull-up path defined by two PMOS pull-up transistors and a pull-down path defined by two NMOS pull-down transistors. An input of the second inverter 32b is electrically connected to an output of the first inverter 30a by the first complementary match line segment MLBn_a. As illustrated, the uppermost PMOS pull-up transistor PEb within the second inverter 32b has a gate terminal that is responsive to a first evaluation control signal (shown as EV1). The lowermost NMOS pull-down transistor NCb within the second inverter 32b has a gate terminal that is responsive to a first connect control signal (shown as CON1).

The second signal repeater 40bc is illustrated as including a first inverter 30b and a second inverter 32c. The first inverter 30b may be defined internally by one PMOS pull-up transistor and one NMOS pull-down transistor. The second inverter 32c, which has a tri-state output, includes a pull-up path defined by two PMOS pull-up transistors and a pull-down path defined by two NMOS pull-down transistors. An input of the second inverter 32c is electrically connected to an output of the first inverter 30b by the second complementary match line segment MLBn_b. As illustrated, the uppermost PMOS pull-up transistor PEc within the second inverter 32c has a gate terminal that is responsive to a zeroth evaluation control signal (shown as EV0). The lowermost NMOS pull-down transistor NCc within the second inverter 32c has a gate terminal that is responsive to a zeroth connect control signal (shown as CON0). These evaluation and connect control signals may be generated by timing and control circuitry (not shown) that is synchronized to a clock signal (e.g., CLK2X), as illustrated by the timing diagram 50 of FIG. 3.

The third signal repeater 40cd is illustrated as including a first inverter 30c and a second inverter 32d. The first inverter 30c may be defined internally by one PMOS pull-up transistor and one NMOS pull-down transistor. The second inverter 32d, which has a tri-state output, includes a pull-up path defined by two PMOS pull-up transistors and a pull-down path defined by two NMOS pull-down transistors. As illustrated, the uppermost PMOS pull-up transistor PEd within the second inverter 32d has a gate terminal that is responsive to the first evaluation control signal (shown as EV1). The lowermost NMOS pull-down transistor NCd within the second inverter 32d has a gate terminal that is responsive to the first connect control signal (shown as CON1).

The first match line segment MLn_a is precharged to a logic 1 voltage (e.g., Vdd) just prior to commencement of a first stage of a pipelined search operation. This precharging operation is performed by PMOS pull-up transistor PUa, which is responsive to the zeroth evaluation control signal EV0. As described more fully hereinbelow with respect to the timing diagram 50 of FIG. 3 and TABLES 1 and 2, a leading edge of the zeroth evaluation control signal, which is an active low signal, will operate to commence precharge of the first match line segment MLn_a. A pair of serially connected PMOS pull-up transistors P1a and P2a are also provided to support the first match line segment MLn_a at its precharged level, by offsetting leakage current losses that may occur in the first segment of CAM cells 20a. As illustrated, a first current carrying terminal of the PMOS pull-up transistor P1a (shown as a drain terminal) is electrically connected to the first match line segment MLn_a and a gate terminal of the PMOS pull-up transistor P1a is electrically connected to an output of the first inverter 30a. The gate terminal of the PMOS pull-up transistor P2a is responsive to a bias signal (shown as PBIAS), which may be a signal having an adjustable or one time programmable (e.g., fuse programmable) dc voltage level (e.g., 0<VPBIAS<0.5(Vdd)). The order of the pull-up transistors P1a and P2a may be reversed. The operating characteristics of the PMOS pull-up transistors P1a and P2a are more fully described in commonly assigned U.S. application Ser. No. 10/323,236, filed Dec. 18, 2002, the disclosure of which is hereby incorporated herein by reference.

A second pair of serially connected PMOS pull-up transistors P1b and P2b are also provided to support any positive voltage on the second match line segment MLn_b, by offsetting leakage current losses that may occur in the second segment of CAM cells 20b. Similarly, a third pair of serially connected PMOS pull-up transistors P1c and P2c are provided to support any positive voltage on the third match line segment MLn_c during search operations. Finally, a fourth pair of serially connected PMOS pull-up transistors P1d and P2d are provided to support any positive voltage on the fourth match line segment MLn_d during search operations. The fourth match line segment MLn_d terminates at an input of a final inverter 30d, which passes a match/miss result to an input of a x80 capture latch 42. As illustrated, the switching of the x80 capture latch 42 is synchronized with a trailing edge of the zeroth connect control signal CON0. The capture latch 42 generates a final active low match line signal MLBn, which may be provided to a priority encoder using conventional techniques.

Figure 3:
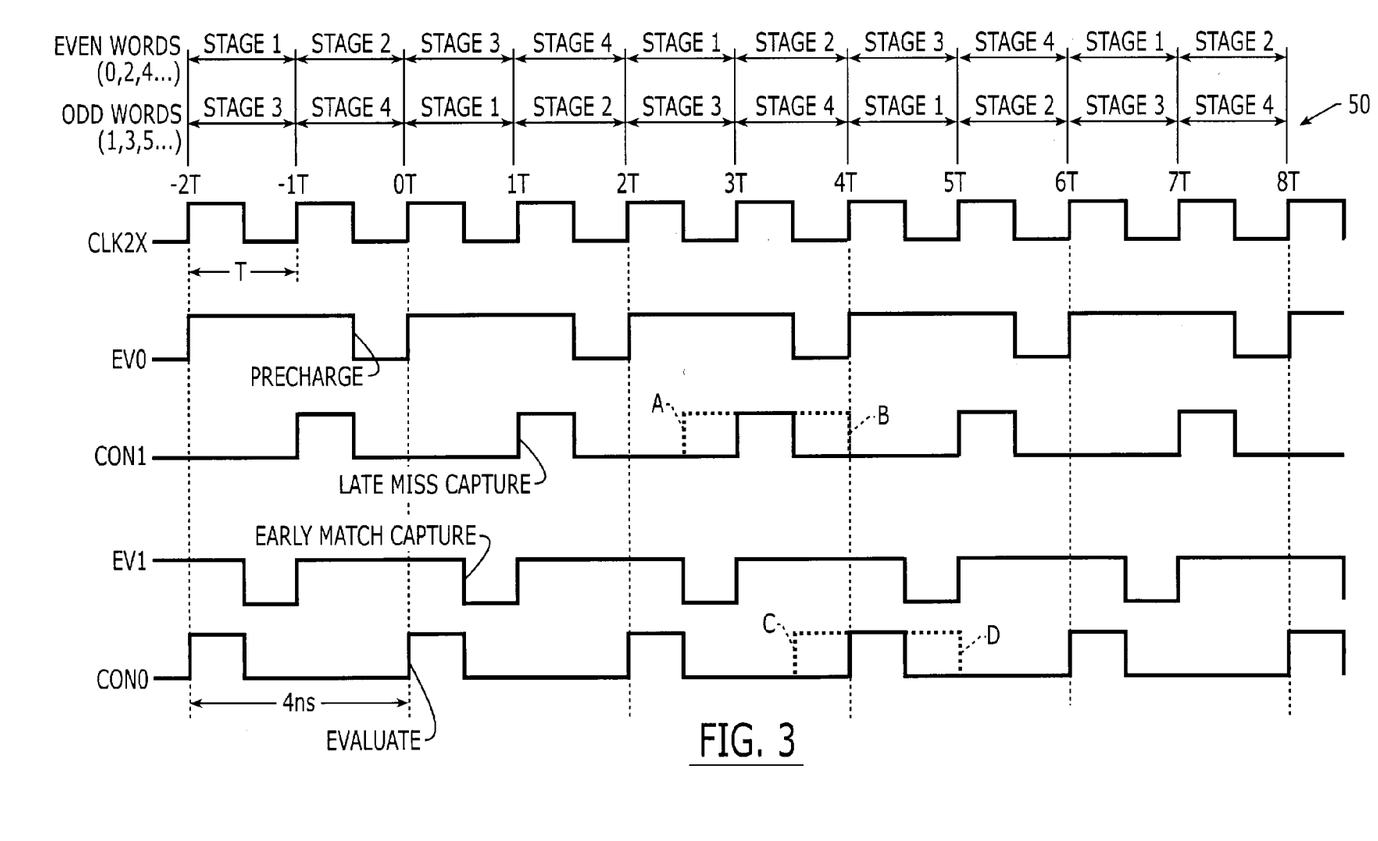
FIG. 3 is a timing diagram that illustrates the timing of control signals applied to the dual-capture match line signal repeater of FIG. 2, according to additional embodiments of the present invention.

Operations performed within the segmented row 100 of CAM cells illustrated by FIG. 2 will now be described more fully with reference to the timing diagram 50 of FIG. 3 and the search operations illustrated by TABLES 1 and 2. In particular, FIG. 3 illustrates the timing of five signals: CLK2X (a synchronizing clock signal having a period of T=2 ns), the zeroth evaluation control signal EV0, the first connect control signal CON1, the first evaluation control signal EV1 and the zeroth connect control signal CON0. As described above, the evaluation control signals EV0 and EV1 are active low signals and the connect control signals CON0 and CON1 are active high signals.

When the zeroth evaluation control signal EV0 switches high-to-low, the first match line segment MLn_a is precharged high to a logic 1 level and the PMOS pull-up transistor PEc within the second inverter 32c is turned on to enable pull-up of the third match line segment MLn_c (when the second complementary match line segment MLBn_b is maintained at a logic 0 level). When the first evaluation control signal EV1 switches high-to-low, the PMOS pull-up transistor PEb within the second inverter 32b is turned on to enable pull-up of the second match line segment MLn_b (when the first complementary match line segment MLBn_a is maintained at a logic 0 level). Switching the first evaluation control signal EV1 high-to-low also causes the PMOS pull-up transistor PEd within the second inverter 32d to turn on and enable pull-up of the fourth match line segment MLn_d (when the third complementary match line segment MLBn_c is maintained at a logic 0 level).

When the zeroth connect control signal CON0 is switched low-to-high, the NMOS pull-down transistor NCc within the second inverter 32c is turned on to enable pull-down of the third match line segment MLn_c (when the second complementary match line segment MLBn_b switches to (or is held at) a logic 1 level). When the first connect control signal CON1 is switched low-to-high, the NMOS pull-down transistor NCb within the second inverter 32b is turned on to enable pull-down of the second match line segment MLn_b (when the first complementary match line segment MLBn_a switches to (or is held at) a logic 1 level). Switching the first connect control signal CON1 low-to-high also causes the NMOS pull-down transistor NCd within the second inverter 32d to turn on and thereby enable pull-down of the fourth match line segment MLn_d (when the third complementary match line segment MLBn_c switches to (or is held at) a logic 1 level). In addition, switching the zeroth connect control signal CON0 high-to-low causes the x80 capture latch 42 to capture the signal at the output of the final inverter 30d. This captured signal is reflected as the final match line signal MLBn.

Referring specifically now to the entries within TABLES 1 and 2 and the timing diagram 50 of FIG. 3, STAGE 1 of a pipelined search operation with respect to an odd search word (e.g., WORD1) and STAGE 3 of a pipelined search operation with respect to an even search word (e.g., WORD0) occur during the time interval from 0T to 1T, which spans 2 ns. During the time interval 0T to 0.5T, bits <0:19> of WORD1 are applied to the 20 pairs of differential data lines (D/DB<0:19>) associated with the first segment of CAM cells 20a and bits <40:59> of WORD0 are simultaneously applied to the 20 pairs of differential data lines (D/DB<40:59>) associated with the third segment of CAM cells 20c. This application of data commences two side-by-side partial word search operations. Just prior to time 0T, the bit lines D/DB<0:19> and <40:59> are held low to represent a global mask condition.

When the first segment of WORD1 is applied to the data lines D/DB<0:19>, the first match line segment MLn_a will be pulled low (i.e., discharged) from a precharged high level if one or more miss conditions are present in the first segment of CAM cells 20a. A "worst" case miss condition exists from a timing standpoint when only CAM cell<0> in the leftmost column of the CAM array detects a miss condition and all other CAM cells<1:19> detect a match condition (i.e., hit). In this case, CAM cell<0> will be solely responsible for pulling down the entire first match line segment MLn_a. Similar "worst" case miss conditions may also exist whenever only a single cell miss condition is present in one of the CAM cells<1:19>. When the third segment of WORD 0 is applied to the data lines D/DB<40:59>, the third match line segment MLn_c will be pulled low (or held low) if one or more miss conditions are present in the third segment of CAM cells 20a.

Also during the time interval from 0T to 0.5T, the previously applied bits <20:39> of WORD0 remain on the differential data lines (D/DB<20:39>) associated with the second segment of CAM cells 20b and the previously applied bits <60:79> of WORD(−1) remain on the differential data lines (D/DB<60:79>) associated with the fourth segment of CAM cells 20d. In addition, because the first evaluation control signal EV1 is inactive at a logic 1 level and the first connect control signal CON1 is inactive at a logic 0 level during the time interval from 0T to 0.5T, the tri-state output of second inverter 32b and the tri-state output of second inverter 32d will be disposed in high impedance states. This will isolate the first match line segment MLn_a from the second match line segment MLn_b (i.e., x20a ML and x20b ML are isolated from each other) and also isolate the third match line segment MLn_c from the fourth match line segment MLn_d (i.e., x20c ML and x20d ML are isolated from each other).

Moreover, because the zeroth connect control signal CON0 switches low-to-high at time 0T, any miss signal generated on the second match line segment MLn_b (during a prior STAGE 2 of the search operation with respect to WORD0) will be captured as this miss signal passes through the second inverter 32c. In particular, if a miss is present from the prior stage, then the second complementary match line segment MLBn_b will be high and the NMOS pull-down transistor NCc associated with the second inverter 32c will be turned on in response to the low-to-high switching of the zeroth connect control signal CON0. This will cause the output of the second inverter 32c to pull (or hold) the third match line segment MLn_c segment low. In many cases, the third match line segment MLn_c segment will not need to be pulled low if it already was low during an immediately prior stage of a search operation. Thus, switching CON0 low-to-high enables the capture of a late miss signal from the second match line segment MLn_b during STAGE 3 of the search operation with respect to WORD 0. Switching the zeroth connect control signal CON0 low-to-high also operates to capture the output of the final inverter 30d, which represents a x80 match condition with respect to a prior word (WORD(-1)) that has finished a fourth stage of its search.

According to a preferred aspect of the match line signal repeaters, if a high-to-low transition of the second match line segment MLn_b is relatively gradual in response to a respective STAGE 2 of a search operation, then the low-to-high transition of the second complementary match line signal MLBn_b may also be relatively gradual, but nonetheless recognized by the second inverter 32c when the NMOS pull-down transistor NCc turns on in response to the active zeroth connect control signal CON0. As described herein, a match signal represents a logic 1 signal on a match line and a miss signal represents a logic 0 signal on a match line. In contrast, a "late" miss signal can represent either a "strong" miss signal that is captured late (relative to a match signal) or a "weak" miss signal that is captured late. A "weak" miss signal represents a logic 0 signal that was developed slowly on a match line (i.e., the high-to-low transition of the match line is not sufficiently abrupt to classify the transition as a "strong" miss signal having a sharp falling edge).

At the commencement of the time interval from 0.5T to 1T, the zeroth connect control signal CON0 switches high-to-low (at time 0.5T) to thereby turn off NMOS transistor NCc within the second inverter 32c. The first evaluation control signal EV1 also switches high-to-low to thereby turn on PMOS pull-up transistor PEb (within the second inverter 32b) and PMOS pull-up transistor PEd (within the second inverter 32d). This enables the "early" capture and passing of any logic 1 match signal from the first match line segment MLn_a to the second match line MLn_b, while data lines D/DB<20:39> are being globally masked (in preparation for STAGE 2 of the search operation with respect to WORD1). This also enables the "early" capture and passing of any logic 1 match signal from the third match line segment MLn_c to the fourth match line MLn_d, while data lines D/DB<60:79> are being globally masked (in preparation for STAGE 4 of the search operation with respect to WORD0). During this time interval from 0.5T to 1T, the second match line segment MLn_b will be isolated from the third match line segment MLn_c (because EV0=1 and CON0=0 and the output of the second inverter 32c is tri-stated), the first segment of WORD1 will remain on data lines D/DB<0:19> and the third segment of WORD0 will remain on data lines D/DB<40:59>.

STAGE 2 of a pipelined search operation with respect to search WORD1 and STAGE 4 of a pipelined search operation with respect to search WORD0 occur during the time interval from 1T to 2T. At the time point 1T, the first evaluation control signal EV1 switches low-to-high and the first connect control signal CON1 switches low-to-high. This enables a late miss signal, if any, to be passed from the first segment of CAM cells 20a to the second segment of CAM cells 20b (i.e., passed through second inverter 32b). This also enables a late miss signal, if any, to be passed from the third segment of CAM cells 20c to the fourth segment of CAM cells 20d (i.e., passed through second inverter 32d). Moreover, because the zeroth evaluation control signal EV0 and the zeroth connect control signal CON0 are held high and low, respectively, during the interval from 1T to 1.5T, the second match line segment MLn_b remains isolated from the third match line segment MLn_c.

During the STAGE 2 and STAGE 4 time intervals, bits <20:39> of WORD1 are applied to the 20 pairs of differential data lines (D/DB<10:39>) associated with the second segment of CAM cells 20b and bits <60:79> of WORD0 are simultaneously applied to the 20 pairs of differential data lines (D/DB<60:79>) associated with the fourth segment of CAM cells 20d. This application of data commences two side-by-side partial word search operations. In addition, the first segment of WORD1 (i.e., bits <0:19>) is maintained on the first segment of data lines D/DB<0:19> and the third segment of WORD0 (i.e., bits <40:59>) is maintained on the third segment of data lines D/DB<40:59>.

When the second segment of WORD1 is applied to the data lines D/DB<20:39> during STAGE 2, the second match line segment MLn_b will be pulled high-to-low (i.e., discharged) if STAGE 1 resulted in a match condition and one or more miss conditions are present in the second segment of CAM cells 20b. Alternatively, the second match line segment MLn_b will be pulled high-to-low if STAGE 1 resulted in an early capture of an erroneous match signal during the time interval 0.5T to 1T, followed by late capture of a "weak" miss signal during the time interval 1T to 1.5T. Finally, the second match line segment MLn_b will remain low during STAGE 2 if it was low at the beginning of STAGE 2 and STAGE 1 did not result in an early capture of a match signal during the time interval 0.5T to 1T.

Likewise, when the fourth segment of WORD0 is applied to the data lines D/DB<60:79> during STAGE 4, the fourth match line segment MLn_d will be pulled high-to-low (i.e., discharged) if STAGE 3 resulted in a match condition and one or more miss conditions are present in the fourth segment of CAM cells 20d. Alternatively, the fourth match line segment MLn_d will be pulled high-to-low if STAGE 3 resulted in an early capture of an erroneous match signal during the time interval 0.5T to 1T, followed by late capture of a "weak" miss signal during the time interval 1T to 1.5T. Finally, the fourth match line segment MLn_d will remain low during STAGE 4 if it was low at the beginning of STAGE 4 and STAGE 3 did not result in an early capture of a match signal during the time interval 0.5T to 1T.

Next, at the commencement of the time interval from 1.5T to 2T, the first connect control signal CON1 switches high-to-low (at time 1.5T) to thereby turn off NMOS transistor NCb within the second inverter 32b and NMOS transistor NCd within the second inverter 32d. This operates to isolate the first match line MLn_a from the second match line MLn_b and also isolate the third match line from the fourth match line MLn_d. At time 1.5T, the zeroth evaluation control signal EV0 switches high-to-low to thereby turn on PMOS pull-up transistor PUa (which precharges the first match line segment MLn_a and prepares it for STAGE 1 of a search operation) and turn on PMOS pull-up transistor PEc (within the second inverter 32c). This turn on of PMOS pull-up transistor PEc enables the "early" capture and passing of any logic 1 match signal from the second match line segment MLn_b to the third match line MLn_c, while data lines D/DB<40:59> are globally masked (in preparation for STAGE 3 of the search operation with respect to WORD1) and the second segment of WORD0 is maintained on the data lines D/DB<20:39>. The fourth segment of WORD0 is also maintained on data lines D/DB<60:79> during the time interval from 1.5T to 2T, to thereby support capture of a final match condition with respect to WORD 0 during the next time interval from 2T to 2.5T (See, e.g., TABLE 2).

STAGES 3 and 4 of the pipelined search operations with respect to WORD1 are next performed during the time intervals from 2T–3T and 3T–4T, respectively. These operations repeat the STAGE 3 operations and STAGE 4 operations described above with respect to WORD0. Moreover, during these final stage operations with respect to WORD1, STAGE 1 operations and STAGE 2 operations are performed with respect to a new word, WORD2. Accordingly, as illustrated best by the timing diagram of FIG. 3 and TABLE 2, the odd words (WORD1, WORD3, . . . ) are searched in a first repeating STAGE1–STAGE4 sequence that spans 8 ns and the even words (WORD0, WORD2, . . . ) are searched in a second repeating STAGE1–STAGE4 sequence that is time shifted relative to the first repeating sequence by a time interval of 2T (4 ns).

TABLE 1

| | |
|---|---|
| 0T to 0.5T STAGES 1 & 3 (EVAL) (LATE CAPTURE) | APPLY SEARCH WORD1<0:19> DISCHARGE x20A ML if x20A MISS MAINTAIN SEARCH WORD0<20:39> ON D/DB<20:39> APPLY SEARCH WORD0<40:59> DISCHARGE x20C ML if x20C MISS and/or x20B LATE MISS CAPTURE MAINTAIN SEARCH WORD(−1)<60:79> ON D/DB<60:79> CAPTURE x80 MATCH/MISS (WORD(−1)) ISOLATE x20A ML FROM x20B ML & ISOLATE x20C ML FROM x20D ML |
| 0.5T to 1T (EARLY CAPTURE) | MAINTAIN SEARCH WORD1<0:19> ON D/DB<0:19> PASS EARLY CAPTURE OF MATCH TO x20B ML GLOBALLY MASK D/DB<20:39> MAINTAIN SEARCH WORD0<40:59> ON D/DB<40:59> PASS EARLY CAPTURE OF MATCH TO x20D ML GLOBALLY MASK D/DB<60:79> ISOLATE x20B ML FROM x20C ML |
| 1T to 1.5T STAGES 2 & 4 (EVAL) (LATE CAPTURE) | MAINTAIN SEARCH WORD1<0:19> ON D/DB<0:19> APPLY SEARCH WORD1<20:39> DISCHARGE x20B ML if x20B MISS and/or x20A LATE MISS CAPTURE MAINTAIN SEARCH WORD0<40:59> ON D/DB<40:59> APPLY SEARCH WORD0<60:79> DISCHARGE x20D ML if x20D MISS and/or x20C LATE MISS CAPTURE ISOLATE x20B ML FROM x20C ML |
| 1.5T to 2T (EARLY CAPTURE) | PRECHARGE x20A ML GLOBALLY MASK D/DB<0:19> MAINTAIN SEARCH WORD1<20:39> of D/DB<20:39> PASS EARLY CAPTURE OF MATCH TO x20C ML GLOBALLY MASK D/DB<40:59> MAINTAIN SEARCH WORD0<60:79> ON D/DB<60:79> ISOLATE x20A ML FROM x20B ML & ISOLATE x20C ML FROM x20D ML |

| | | |
|---|---|---|
| 0T to 0.5T STAGES 1 & 3 | APPLY SEARCH WORD1<0:19> MAINTAIN SEARCH WORD(−1)<60:79> ON D/DB<60:79> CAPTURE x80 MATCH/MISS (WORD(−1)) DISCHARGE x20A ML if x20A MISS | APPLY SEARCH WORD0<40:59> MAINTAIN SEARCH WORD0<20:39> ON D/DB<20:39> ISOLATE x20A ML FROM x20B ML & ISOLATE x20C ML FROM x20D ML DISCHARGE x20C ML if x20C MISS and/or x20B LATE MISS CAPTURE |
| 0.5T to 1T | PASS EARLY CAPTURE OF MATCH TO x20B ML GLOBALLY MASK D/DB<20:39> & ISOLATE x20B ML FROM x20C ML | PASS EARLY CAPTURE OF MATCH TO x20D ML GLOBALLY MASK D/DB<60:79> |
| 1T to 1.5T STAGES 2 & 4 | APPLY SEARCH WORD1<20:39> MAINTAIN SEARCH WORD1<0:19> ON D/DB<0:19> ISOLATE x20B ML FROM x20C ML DISCHARGE x20B ML if x20B MISS and/or x20A LATE MISS CAPTURE | APPLY SEARCH WORD0<60:79> MAINTAIN SEARCH WORD0<40:59> ON D/DB<40:59>  DISCHARGE x20D ML if x20D MISS and/or x20C LATE MISS CAPTURE |
| 1.5T to 2T | PASS EARLY CAPTURE OF MATCH TO x20C ML GLOBALLY MASK D/DB<40:59> & ISOLATE x20C ML FROM x20D ML | PRECHARGE x20A ML GLOBALLY MASK D/DB<0:19> & ISOLATE x20A ML FROM x20B ML |
| 2T to 2.5T STAGES 3 & 1 | APPLY SEARCH WORD1<40:59> MAINTAIN SEARCH WORD1<20:39> ON D/DB<20:39> ISOLATE x20A ML FROM x20B ML & ISOLATE x20C ML FROM x20D ML DISCHARGE x20C ML if x20C MISS and/or x20B LATE MISS CAPTURE | APPLY SEARCH WORD2<0:19> MAINTAIN SEARCH WORD0<60:79> ON D/DB<60:79> CAPTURE x80 MATCH/MISS (SEARCH WORD0) DISCHARGE x20A ML if x20A MISS |
| 2.5T to 3T | PASS EARLY CAPTURE OF MATCH TO x20D ML GLOBALLY MASK D/DB<60:79> | PASS EARLY CAPTURE OF MATCH TO x20B ML GLOBALLY MASK D/DB<20:39> & ISOLATE x20B ML FROM x20C ML |
| 3T to 3.5T STAGES 4 & 2 | APPLY SEARCH WORD1<60:79> MAINTAIN SEARCH WORD1<40:59> ON D/DB<40:59> ISOLATE x20B ML FROM x20C ML DISCHARGE x20D ML if x20D MISS and/or x20C LATE MISS CAPTURE | APPLY SEARCH WORD2<20:39> MAINTAIN SEARCH WORD2<0:19> ON D/DB<0:19>  DISCHARGE x20B ML if x20B MISS and/or x20A LATE MISS CAPTURE |
| 3.5T to 4T | PRECHARGE x20A ML GLOBALLY MASK D/DB<0:19> & ISOLATE x20A ML FROM x20B ML | PASS EARLY CAPTURE OF MATCH TO x20C ML GLOBALLY MASK D/DB<40:59> & ISOLATE x20C ML FROM x20D ML |

-continued

| | |
|---|---|
| 4T to 4.5T | APPLY SEARCH WORD3<0:19> |
| STAGES 1 & 3 | MAINTAIN SEARCH WORD1<60:79> ON D/DB<60:79> |
| | CAPTURE x80 MATCH/MISS (SEARCH WORD1) |
| | DISCHARGE x20A ML IF x20A MISS |
| 4.5T to 5T | PASS EARLY CAPTURE OF MATCH TO x20B ML |
| | GLOBALLY MASK D/DB<20:39> & ISOLATE x20B ML FROM x20C ML |
| 5T to 5.5T | APPLY SEARCH WORD3<20:39> |
| STAGES 2 & 4 | MAINTAIN SEARCH WORD3<0:19> ON D/DB<0:19> |
| | ISOLATE x20B ML FROM x20C ML |
| | DISCHARGE x20B ML if x20B MISS and/or x20A LATE MISS CAPTURE |
| 5.5T to 6T | PASS EARLY CAPTURE OF MATCH TO x20C ML |
| | GLOBALLY MASK D/DB<40:59> & ISOLATE x20C ML FROM x20D ML |
| 6T to 6.5T | APPLY SEARCH WORD3<40:59> |
| STAGES 3 & 1 | MAINTAIN SEARCH WORD3<20:39> ON D/DB<20:39> |
| | ISOLATE x20A ML FROM x20B ML & ISOLATE x20C ML FROM x20D ML |
| | DISCHARGE x20C ML if x20C MISS and/or x20B LATE MISS CAPTURE |
| 6.5T to 7T | PASS EARLY CAPTURE OF MATCH TO x20D ML |
| | GLOBALLY MASK D/DB<60:79> |
| 7T to 7.5T | APPLY SEARCH WORD3<60:79> |
| STAGES 4 & 2 | MAINTAIN SEARCH WORD3<40:59> ON D/DB<40:59> |
| | ISOLATE x20B ML FROM x20C ML |
| | DISCHARGE x20D ML if x20D MISS and/or x20C LATE MISS CAPTURE |
| 7.5T to 8T | PRECHARGE x20A ML |
| | GLOBALLY MASK D/DB<0:19> & ISOLATE x20A ML FROM x20B ML |
| 8T to 8.5T | APPLY SEARCH WORD5<0:19> |
| STAGES 1 & 3 | MAINTAIN SEARCH WORD3<60:79> ON D/DB<60:79> |
| | CAPTURE x80 MATCH/MISS (SEARCH WORD3) |
| | DISCHARGE x20A ML IF x20A MISS |
| | APPLY SEARCH WORD2<40:59> |
| | MAINTAIN SEARCH WORD2<20:39> ON D/DB<20:39> |
| | ISOLATE x20A ML FROM x20B ML & ISOLATE x20C ML FROM x20D ML |
| | DISCHARGE x20C ML if x20C MISS and/or x20B LATE MISS CAPTURE |
| | PASS EARLY CAPTURE OF MATCH TO x20D ML |
| | GLOBALLY MASK D/DB<60:79> |
| | APPLY SEARCH WORD2<60:79> |
| | MAINTAIN SEARCH WORD2<40:59> ON D/DB<40:59> |
| | DISCHARGE x20D ML if x20D MISS and/or x20C LATE MISS CAPTURE |
| | PRECHARGE x20A ML |
| | GLOBALLY MASK D/DB<0:19> & ISOLATE x20A ML FROM x20B ML |
| | APPLY SEARCH WORD4<0:19> |
| | MAINTAIN SEARCH WORD2<60:79> ON D/DB<60:79> |
| | CAPTURE x80 MATCH/MISS (SEARCH WORD2) |
| | DISCHARGE x20A ML if x20A MISS |
| | PASS EARLY CAPTURE OF MATCH TO x20B ML |
| | GLOBALLY MASK D/DB<20:39> & ISOLATE x20B ML FROM x20C ML |
| | APPLY SEARCH WORD4<20:39> |
| | MAINTAIN SEARCH WORD4<0:19> ON D/DB<0:19> |
| | DISCHARGE x20B ML if x20B MISS and/or x20A LATE MISS CAPTURE |
| | PASS EARLY CAPTURE OF MATCH TO x20C ML |
| | GLOBALLY MASK D/DB<40:59> & ISOLATE x20C ML FROM x20D ML |
| | APPLY SEARCH WORD4<40:59> |
| | MAINTAIN SEARCH WORD4<20:39> ON D/DB<20:39> |
| | ISOLATE x20A ML FROM x20B ML & ISOLATE x20C ML FROM x20D ML |
| | DISCHARGE x20C ML if x20C MISS and/or x20B LATE MISS CAPTURE |

The timing diagram of FIG. 3 also demonstrates alternative embodiments that modify the timing of the connect control signals CON0 and CON1. For example, the dotted lines A and B in FIG. 3 represent an earlier rising edge and a later falling edge of the first connect control signal CON1, respectively. Similarly, the dotted lines C and D in FIG. 3 represent an earlier rising edge and a later falling edge of the zeroth connect control signal CON0, respectively. In the event the connect control signal CON0 (CON1) has a rising edge as shown by the dotted line C (A), then the dual-capture match line signal repeater will operate to capture early miss signals and early match signals during the same time intervals. Nonetheless, late capture of late miss signals will still be provided. Moving the rising edges of the connect control signals CON0 and CON1 forward in time as shown by the dotted lines C and A, respectively, may be less preferred because it typically results in greater power consumption, particularly if the second inverters 32b, 32c and 32d are switched slowly in response to "weak" miss signals (gradual high-to-low transition of a respective match line segment). Slow switching of an inverter results in higher current consumption because it causes a direct resistive path to form between the power supply lines (Vdd and Vss) when the PMOS and NMOS transistors are simultaneously conductive.

As illustrated by TABLE 3, each CAM array includes a bit line and data line driver circuit (not shown) that drives the data lines (D/DB<0:79>) with segments of the search words during the pipelined search operations. These data line driving operations are interleaved with global masking operations that may be implemented using a dedicated mask cell sub-array containing global mask cells. An exemplary dedicated mask cell sub-array is more fully described in commonly assigned U.S. application Ser. No. 10/386,400, filed Mar. 11, 2003, the disclosure of which is hereby incorporated herein by reference.

TABLE 3

| STAGES | TIME | D/DB <0:19> | D/DB <20:39> | D/DB <40:59> | D/DB <60:79> |
|---|---|---|---|---|---|
| 1 AND 3 | 0T to 0.5T | WORD 1 | WORD 0 | WORD 0 | WORD −1 |
| | 0.5T to 1T | WORD 1 | MASK | WORD 0 | MASK |
| 2 AND 4 | 1T to 1.5T | WORD 1 | WORD 1 | WORD 0 | WORD 0 |
| | 1.5T to 2T | MASK | WORD 1 | MASK | WORD 0 |
| 3 AND 1 | 2T to 2.5T | WORD 2 | WORD 1 | WORD 1 | WORD 0 |
| | 2.5T to 3T | WORD 2 | MASK | WORD 1 | MASK |
| 4 AND 2 | 3T to 3.5T | WORD 2 | WORD 2 | WORD 1 | WORD 1 |
| | 3.5T to 4T | MASK | WORD 2 | MASK | WORD 1 |
| 1 AND 3 | 4T to 4.5T | WORD 3 | WORD 2 | WORD 2 | WORD 1 |
| | 4.5T to 5T | WORD 3 | MASK | WORD 2 | MASK |
| 2 AND 4 | 5T to 5.5T | WORD 3 | WORD 3 | WORD 2 | WORD 2 |
| | 5.5T to 6T | MASK | WORD 3 | MASK | WORD 2 |
| 3 AND 1 | 6T to 6.5T | WORD 4 | WORD 3 | WORD 3 | WORD 2 |
| | 6.5T to 7T | WORD 4 | MASK | WORD 3 | MASK |
| 4 AND 2 | 7T to 7.5T | WORD 4 | WORD 4 | WORD 3 | WORD 3 |
| | 7.5T to 8T | MASK | WORD 4 | MASK | WORD 3 |
| 1 AND 3 | 8T to 8.5T | WORD 5 | WORD 4 | WORD 4 | WORD 3 |
| | 8.5T to 9T | WORD 5 | MASK | WORD 4 | MASK |
| 2 AND 4 | 9T to 9.5T | WORD 5 | WORD 5 | WORD 4 | WORD 4 |
| | 9.5T to 10T | MASK | WORD 5 | MASK | WORD 4 |

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A content addressable memory (CAM) array, comprising:
   a row of CAM cells having at least xR and xS segments of CAM cells therein that include xR and xS match line segments, respectively, where 2R and 2S are positive integers; and
   a dual-capture match line signal repeater that is configured to isolate the xR and xS match line segments from each other during a first evaluation time interval, pass a match signal from the xR match line segment to the xS match line segment during a first capture time interval and pass a late miss signal from the xR match line segment to the xS match line segment during a second capture time interval that terminates after termination of the first capture time interval.

2. The CAM array of claim 1, wherein the second capture time interval commences upon termination of the first capture time interval; and wherein said dual-capture match line signal repeater is further configured to block transfer of the match signal from the xR match line segment to the xS match line segment during the second capture time interval.

3. The CAM array of claim 1, wherein the first and second capture time intervals overlap in time; and wherein said dual-capture match line signal repeater is further configured to block transfer of the match signal from the xR match line segment to the xS match line segment during at least a portion of the second capture time interval.

4. The CAM array of claim 1, wherein said dual-capture match line signal repeater comprises:
   a first inverter having an input electrically connected to the xR match line segment; and
   a second inverter having an input electrically coupled to an output of said first inverter and a tri-state output electrically coupled to the xS match line segment, said second inverter responsive to a first evaluation control signal and a first connect control signal.

5. The CAM array of claim 4, wherein the first evaluation control signal is an active low signal and the first connect control signal is an active high signal.

6. The CAM array of claim 5, wherein a falling edge of the first evaluation control signal signifies commencement of the first capture time interval;
   and wherein a rising edge of the first connect control signal signifies commencement of the second capture time interval.

7. The CAM array of claim 1, further comprising:
   a pair of PMOS pull-up transistors electrically connected in series between the xR match line segment and a power supply line, said pair of PMOS pull-up transistors comprising a first PMOS pull-up transistor having a gate terminal that is responsive to a PBIAS signal and a second PMOS pull-up transistor having a gate terminal that is electrically connected to an output of said first inverter.

8. The CAM array of claim 1, further comprising:
   a PMOS precharge transistor having a first current carrying terminal electrically connected to the xR match line segment, a second current carrying terminal electrically coupled to a power supply line and a gate terminal that is responsive to a zeroth evaluation control signal.

9. The CAM array of claim 8, wherein said dual-capture match line signal repeater comprises:
   a first inverter having an input electrically connected to the xR match line segment; and
   a second inverter having an input electrically coupled to an output of said first inverter and a tri-state output electrically coupled to the xS match line segment, said second inverter responsive to a first evaluation control signal and a first connect control signal.

10. The CAM array of claim 1, wherein the first evaluation time interval is synchronized to a zeroth evaluation control signal, the first capture time interval is synchronized to a first evaluation control signal and the second capture time interval is synchronized to a first connect control signal.

11. A content addressable memory (CAM) array, comprising:
    a row of CAM cells having at least xR, xS and xT segments of CAM cells therein that include xR, xS and xT match line segments, respectively, where 2R, 2S and 2T are positive integers;
    a first dual-capture match line signal repeater that is configured to isolate the xR and xS match line segments from each other during an first evaluation time interval, pass a match signal from the xR match line segment to the xS match line segment during a first early capture time interval and pass a late miss signal from the xR match line segment to the xS match line segment during a first late capture time interval that terminates after termination of the first early capture time interval; and
    a second dual-capture match line signal repeater that is configured to isolate the xS and xT match line segments from each other during a second evaluation time interval, pass a match signal from the xS match line segment to the xT match line segment during a zeroth early capture time interval and pass a late miss signal from the xS match line segment to the xT match line segment during a zeroth late capture time interval that terminates after termination of the zeroth early capture time interval.

12. The CAM array of claim 11, wherein the first late capture time interval and the first early capture time interval do not overlap in time.

13. The CAM array of claim 11, wherein said first dual-capture match line signal repeater comprises:
    a first inverter having an input electrically connected to the xR match line segment; and
    a second inverter having an input electrically coupled to an output of said first inverter and a tri-state output electrically coupled to the xS match line segment, said second inverter responsive to a first evaluation control signal and a first connect control signal.

14. The CAM array of claim 13, wherein said second dual-capture match line signal repeater comprises:
    a third inverter having an input electrically connected to the xS match line segment; and
    a fourth inverter having an input electrically coupled to an output of said third inverter and a tri-state output electrically coupled to the xT match line segment, said fourth inverter responsive to a zeroth evaluation control signal and a zeroth connect control signal.

15. The CAM array of claim 14, further comprising:
    a PMOS precharge transistor having a first current carrying terminal electrically connected to the xR match line segment, a second current carrying terminal electrically coupled to a power supply line and a gate terminal that is responsive to the zeroth evaluation control signal.

16. A method of searching a CAM array, comprising the steps of:
precharging a first match line segment that is connected to a first segment of CAM cells in a first row of the CAM array; and
performing a staged search operation by:
applying a first segment of a search word to first data lines that are electrically coupled to the first segment of CAM cells while concurrently isolating the first match line segment from a second match line segment that is connected to a second segment of CAM cells in the first row of the CAM array;
passing a match signal from the first match line segment to the second match line segment, during a first capture time interval; and
correcting an erroneous capture of the match signal by passing a late miss signal from the first match line segment to the second match line segment during a second capture time interval that terminates after termination of the first capture time interval.

17. The method of claim 16, wherein said step of passing a late miss signal is performed concurrently with a step of applying a second segment of the search word to second data lines that are electrically coupled to the second segment of CAM cells.

18. The method of claim 17, wherein said step of passing a match signal is performed concurrently with a step of globally masking the second data lines.

19. The method of claim 18, wherein said step of passing a match signal is performed in-sync with a first evaluation control signal; and wherein said step of correcting an erroneous capture is performed in-sync with a first connect control signal.

20. The method of claim 16, wherein said step of passing a match signal is performed in-sync with a first evaluation control signal; and wherein said step of correcting an erroneous capture is performed in-sync with a first connect control signal.

21. A method of searching a CAM array having first, second, third and fourth segments of CAM cells therein, comprising the steps of:
applying a first segment of a search word to first data lines that are electrically coupled to the first segment of CAM cells while simultaneously applying a third segment of a prior search word to third data lines that are electrically coupled to the third segment of CAM cells;
passing an first match signal from a first match line segment associated with the first segment of CAM cells to a second match line segment associated with the second segment of CAM cells, while concurrently passing a second match signal from a third match line segment associated with the third segment of CAM cells to a fourth match line segment associated with the fourth segment of CAM cells, during a first capture time interval; and
passing a first late miss signal from the first match line segment to the second match line segment and a second late miss signal from the third match line segment to the fourth match line segment, during a second capture time interval that terminates after termination of the first capture time interval.

22. The method of claim 21, wherein the first and second capture time intervals are nonoverlapping.

23. A content addressable memory (CAM) array, comprising: a row of CAM cells comprising first and second match line segments; and a dual-capture match line signal repeater electrically connected to the first and second match line segments, said repeater comprising: a first inverter having an input electrically coupled to the first match line segment; and a second inverter having an input electrically coupled to an output of said first inverter and a tri-state output electrically coupled to the second match line segment, said second inverter having a pull-up path therein that is enabled in response to an active evaluation control signal and a pull-down path therein that is enabled in response to an active connect control signal.

24. The CAM array of claim 23, wherein the evaluation control signal is an active low signal; and wherein the connect control signal is an active high signal.

25. A content addressable memory (CAM) array, comprising:
a row of CAM cells having at least xR and xS segments of CAM cells therein that include xR and xS match line segments, respectively, where 2R and 2S are positive integers; and
a dual-capture match line signal repeater that is configured to:
transfer a match signal from the xR match line segment to the xS match line segment during an early capture time interval while simultaneously blocking transfer of a miss signal from the xR match line segment to the xS match line segment; and
transfer the miss signal from the xR match line segment to the xS match line segment during a late capture time interval that terminates after termination of the early capture time interval.

26. The CAM array of claim 25, wherein said dual-capture match line signal repeater is further configured to block transfer of the match signal from the xR match line segment to the xS match line segment during at least a portion of the late capture time interval.

27. The CAM array of claim 26, wherein the late capture time interval commences upon termination of the early capture time interval.

28. The CAM array of claim 26, wherein said dual-capture match line signal repeater is further configured to block transfer of the match signal from the xR match line segment to the xS match line segment during the entire late capture time interval.

29. The CAM array of claim 26, wherein said dual-capture match line signal repeater comprises an inverter having a tri-state output that is electrically connected to the xS match line segment.

30. A method of performing a pipelined search operation within a segmented CAM array, comprising the steps of:
applying a first segment of a search word to first data lines that are electrically coupled to the first segment of CAM cells during a first stage of the pipelined search operation; then
passing a match signal from a first match line segment associated with the first segment of CAM cells to a second match line segment associated with a second segment of CAM cells, while second data lines that are electrically coupled to the second segment of CAM cells are being globally masked; and then
applying a second segment of the search word to the second data lines during a second stage of the pipelined search operation, while simultaneously passing a late miss signal from the first match line segment to the second match line segment to thereby discharge the second match line segment.

31. A method of performing a pipelined search operation within a segmented CAM array, comprising the steps of:
passing an early match signal from a first segment of CAM cells to a second segment of CAM cells during a first stage of a pipelined search operation, while simultaneously blocking passage of an early miss signal from the first segment of CAM cells to the second segment of CAM cells; and
passing a late miss signal from the first segment of CAM cells to the second segment of CAM cells during a second stage of the pipelined search operations while simultaneously blocking passage of a late match signal from the first segment of CAM cells to the second segment of CAM cells.

32. The method of claim 31, wherein said step of passing a late miss signal comprises passing a late miss signal in-sync with applying a second segment of a search word to data lines coupled to the second segment of CAM cells.

33. The method of claim 32, wherein said step of passing an early match signal comprises passing an early match signal in-sync with globally masking data lines coupled to the second segment of CAM cells.

34. The method of claim 31, wherein said step of passing an early match signal comprises passing an early match signal in-sync with globally masking data lines coupled to the second segment of CAM cells.

* * * * *

UNITED STATES PATENT AND TRADEMARK OFFICE
CERTIFICATE OF CORRECTION

PATENT NO. : 6,965,519 B1  Page 1 of 1
DATED : November 15, 2005
INVENTOR(S) : Park et al.

It is certified that error appears in the above-identified patent and that said Letters Patent is hereby corrected as shown below:

Column 18,
Line 40, change "claim 26" to -- claim 25 --.

Signed and Sealed this

Third Day of January, 2006

JON W. DUDAS
*Director of the United States Patent and Trademark Office*